United States Patent
Chang et al.

(10) Patent No.: US 10,147,726 B1
(45) Date of Patent: Dec. 4, 2018

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/629,768

(22) Filed: Jun. 22, 2017

(30) Foreign Application Priority Data

May 17, 2017 (CN) .......................... 2017 1 0347199

(51) Int. Cl.
*H01L 27/108* (2006.01)
*H01L 23/535* (2006.01)

(52) U.S. Cl.
CPC ...... *H01L 27/10814* (2013.01); *H01L 23/535* (2013.01); *H01L 27/10855* (2013.01)

(58) Field of Classification Search
CPC ............. H01L 27/108; H01L 27/10814; H01L 27/10855; H01L 23/535
See application file for complete search history.

(56) References Cited

U.S. PATENT DOCUMENTS

| | | | | |
|---|---|---|---|---|
| 6,483,141 | B2 * | 11/2002 | Sano | ................ H01L 27/10855 257/306 |
| 6,815,752 | B2 * | 11/2004 | Kitamura | .............. H01L 23/485 257/306 |
| 8,008,159 | B2 * | 8/2011 | Nishi | ................ H01L 27/10855 257/E21.008 |
| 9,041,122 | B2 | 5/2015 | Yoo et al. | |
| 9,048,293 | B2 | 6/2015 | Lee | |
| 9,349,724 | B2 | 5/2016 | Kim et al. | |
| 9,559,103 | B2 | 1/2017 | Park et al. | |
| 9,576,902 | B2 | 2/2017 | Park et al. | |
| 9,754,943 | B1 * | 9/2017 | Chang | ............... H01L 27/10808 |
| 2012/0119327 | A1 * | 5/2012 | Kwon | ............... H01L 27/10852 257/532 |
| 2012/0228702 | A1 * | 9/2012 | Wu | ..................... H01L 29/4236 257/330 |
| 2013/0009226 | A1 * | 1/2013 | Park | ................. H01L 27/10855 257/296 |
| 2015/0054086 | A1 * | 2/2015 | Saino | .................. H01L 29/0649 257/369 |

(Continued)

Primary Examiner — Fazli Erdem
(74) Attorney, Agent, or Firm — Winston Hsu (57) ABSTRACT

A method for fabricating a semiconductor device includes the following steps. First, a contact structure is formed in the insulating layer. Preferably, the contact structure includes a bottom portion in part of the insulating layer and a top portion on part of the bottom portion and extending to cover part of the insulating layer. Next, a dielectric layer is formed on the bottom portion and the top portion, part of the dielectric layer is removed to form a first opening exposing part of the top portion and part of the bottom portion, and a capacitor is formed in the first opening and contacting the pad portion and the contact portion directly.

13 Claims, 11 Drawing Sheets

(56) References Cited

U.S. PATENT DOCUMENTS

| | | | |
|---|---|---|---|
| 2015/0235950 A1* | 8/2015 | Han | H01L 21/76802 257/773 |
| 2017/0005099 A1 | 1/2017 | Lee et al. | |
| 2017/0077102 A1* | 3/2017 | Kim | H01L 27/10814 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming contact plugs within dynamic random access memory (DRAM) cell.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating a semiconductor device includes the following steps. First, a contact structure is formed in the insulating layer. Preferably, the contact structure includes a bottom portion in part of the insulating layer and a top portion on part of the bottom portion and extending to cover part of the insulating layer. Next, a dielectric layer is formed on the bottom portion and the top portion, part of the dielectric layer is removed to form a first opening exposing part of the top portion and part of the bottom portion, and a capacitor is formed in the first opening and contacting the pad portion and the contact portion directly.

According to an embodiment of the present invention, a semiconductor device includes a contact structure in an insulating layer and a capacitor on the contact structure. Preferably, the contact structure includes a bottom portion in the insulating layer and a top portion on part of the bottom portion and extending to cover part of the insulating layer. The capacitor preferably is disposed on the contact structure and directly contacting the top portion and the bottom portion.

According to another aspect of the present invention, a semiconductor device includes a contact structure in an insulating layer and a capacitor on the contact structure. Preferably, the contact structure includes a bottom portion in the insulating layer and a top portion on part of the bottom portion and extending to cover part of the insulating layer. The capacitor on the other hand includes a main portion on the top portion and an extension portion protruding from a bottom surface of the main portion, in which the extension portion is inserted into part of the top portion and a bottom surface of the extension portion contacting the top portion directly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
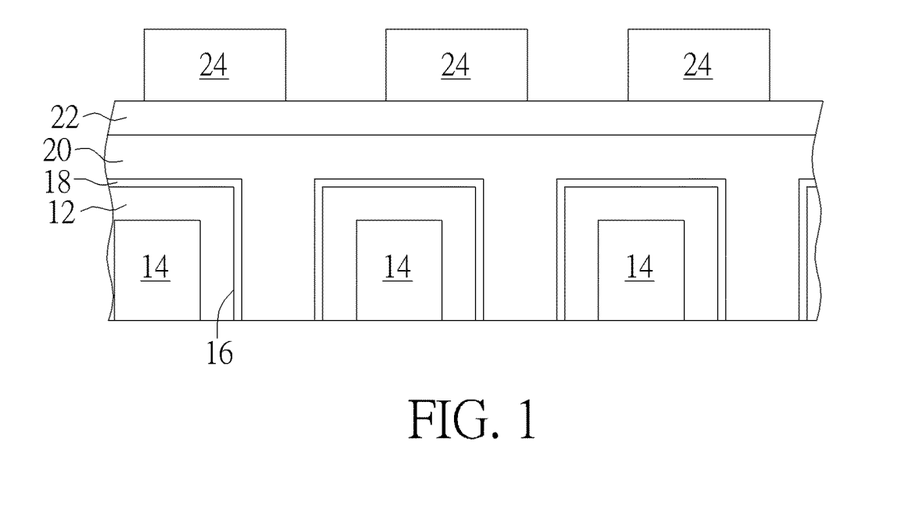
FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, an insulating layer 12 is provided and bit line structures 14 are disposed in the insulating layer 12, in which both the insulating layer 12 and the bit line structures 14 could be disposed on a semiconductor substrate (not shown) and DRAM elements including but not limited to for example doped regions and word lines structures could be disposed in the semiconductor substrate under the bit line structures 14. In this embodiment, the insulating layer 12 preferably being an interlayer dielectric (ILD) layer disposed directly on the word line structures of a DRAM cell, in which the insulating layer 12 could be a single layered or multiple layered insulating material including but not limited to for example silicon oxide, silicon nitride, silicon oxynitride, or combination thereof.

Next, a photo-etching process is conducted to remove part of the insulating layer 12 to form at least an opening, such as the openings 16 in the insulating layer 12, and a barrier layer 18 and a conductive layer 20 are formed on the insulating layer 12 to fill the openings 16. Next, a mask layer 22 and a patterned mask are formed on the conductive layer 20. In this embodiment, the barrier layer 18 could including material such as but not limited to for example TiN, TaN, or combination thereof, the conductive layer 20 could include material such as but not limited to for example Al, Cr, Cu, Ta, Mo, W, or combination thereof, the mask layer 22 preferably includes SiN, and the patterned mask preferably includes a patterned resist 24.

Figure 2:
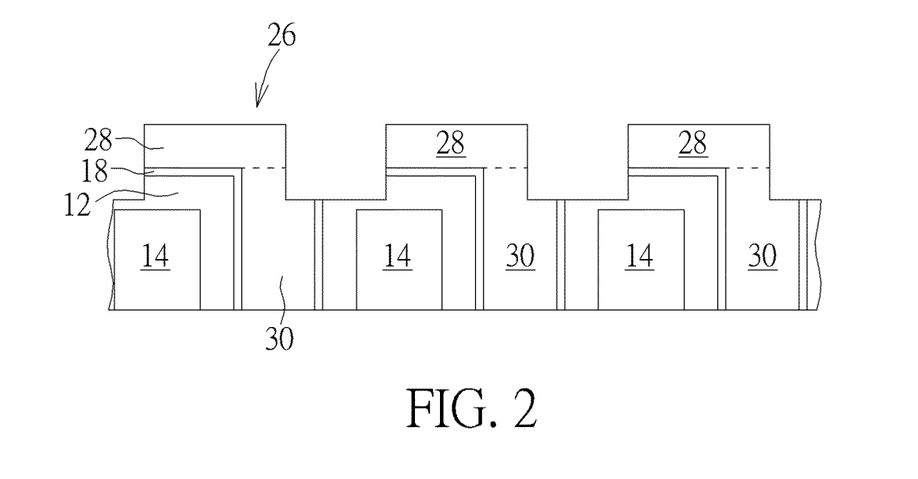

Next, as shown in FIG. 2, at least an etching process is conducted by using the patterned resist 24 as mask to remove part of the mask layer 22, part of the conductive layer 20, and part of the barrier layer 18, and after stripping the mask layer 20 completely, contact structures 26 are formed. Specifically, the etching process conducted to form the contact structures 26 could include multiple etching processes to remove part of the mask layer 22, part of the conductive layer 20, and part of the barrier layer 18, in which the content of the gas could be adjusted depending on the material of each layer accordingly. For instance, the gas used to remove part of the mask layer 22 could be selected from the group consisting of $CF_4$, $CHF_3$, $CH_2F_2$, and $CH_3F$, the gas used to remove part of the conductive layer could be selected from the group consisting of $NF_3$ and $SF_6$, the gas used to remove part of the barrier layer could be selected from the group consisting of $Cl_2$, $NF_3$, and $SF_6$, and the gas used to completely remove the remaining mask layer 22 could be selected from the group consisting of $CF_4$, $CHF_3$, $CH_2F_2$, and $CH_3F$.

In this embodiment, the contact structures 26 are preferably storage node pads or capacitor pads used to electrically connect the capacitor and doped region in the DRAM cell, in which the contact structures 26 after the aforementioned etching process preferably includes a bottom portion 30 disposed in the insulating layer 12 and a top portion 28 disposed on part of the bottom portion 30 and extending to cover part of the insulating layer 12 and part of the bit line structures 14.

Figure 3:
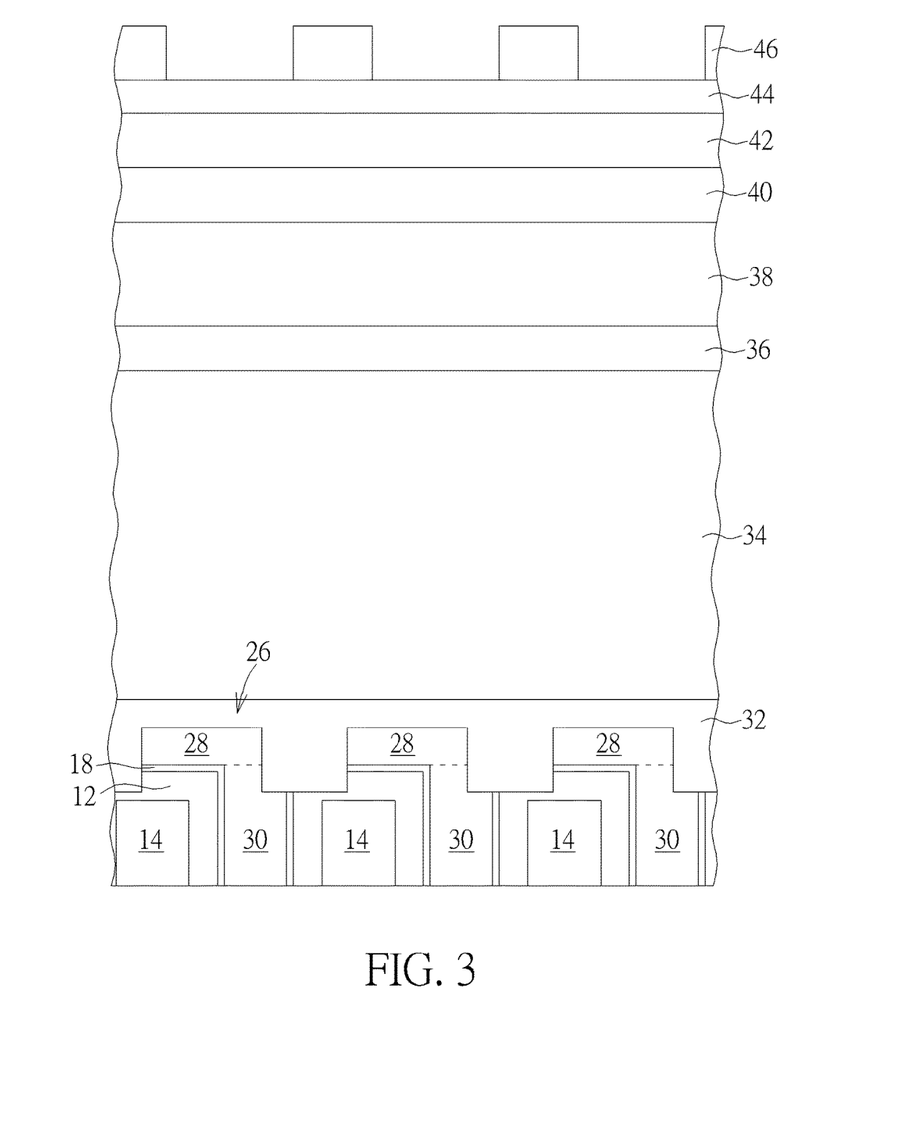

Next, as shown in FIG. 3, a plurality of dielectric layers are formed on the contact structures 26. In this embodiment, the dielectric layers include a silicon nitride layer 32, a silicon oxide layer 34, a silicon nitride layer 36, a mask layer 38 made of amorphous silicon, and another mask layer 40 made of oxides. Next, a photo-etching process is conducted to pattern the dielectric layers by first forming an organic dielectric layer (ODL) 42, a silicon-containing hard mask bottom anti-reflective coating (SHB) 44, and a patterned resist 46 on the mask layer 40.

Figure 4:
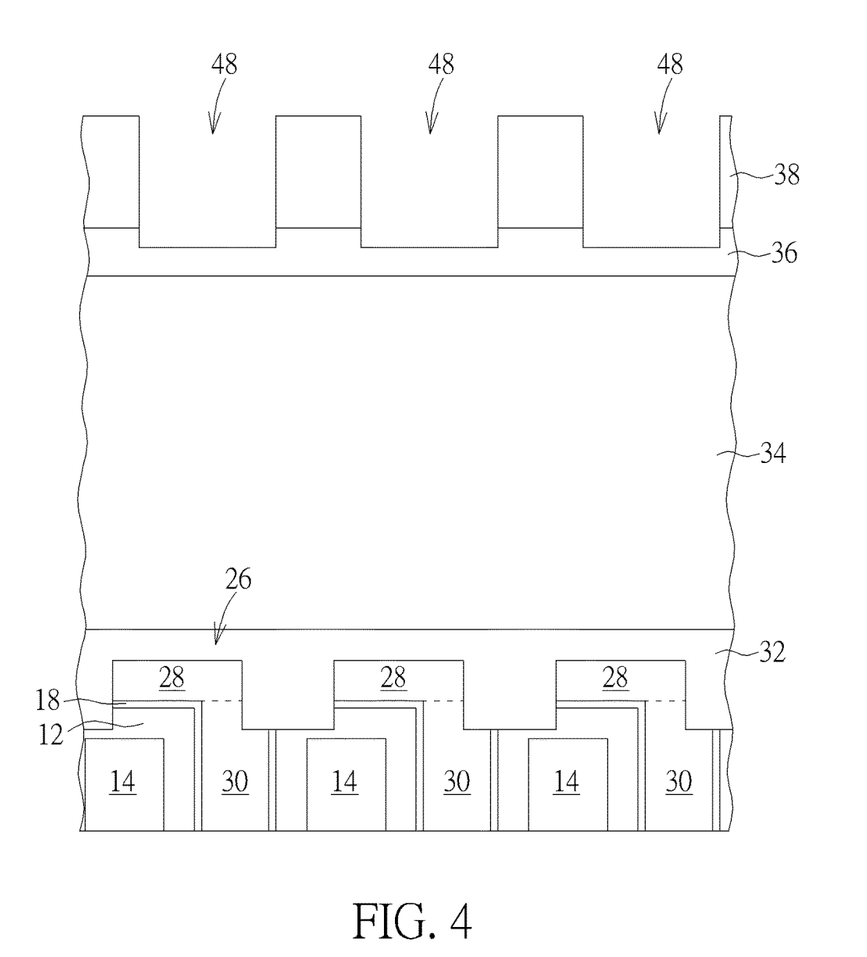

Next, as shown in FIG. 4, single or multiple etching processes are conducted by using the patterned resist 46 as mask to remove part of the SHB 44, part of the ODL 42, part of the mask layer 40, part of the mask layer 38, and part of the silicon nitride layer 36 to form openings 48 without exposing the silicon oxide layer 34. Next, the remaining patterned resist 46, SHB 44, ODL 42, and mask layer 40 are removed.

Figure 5:
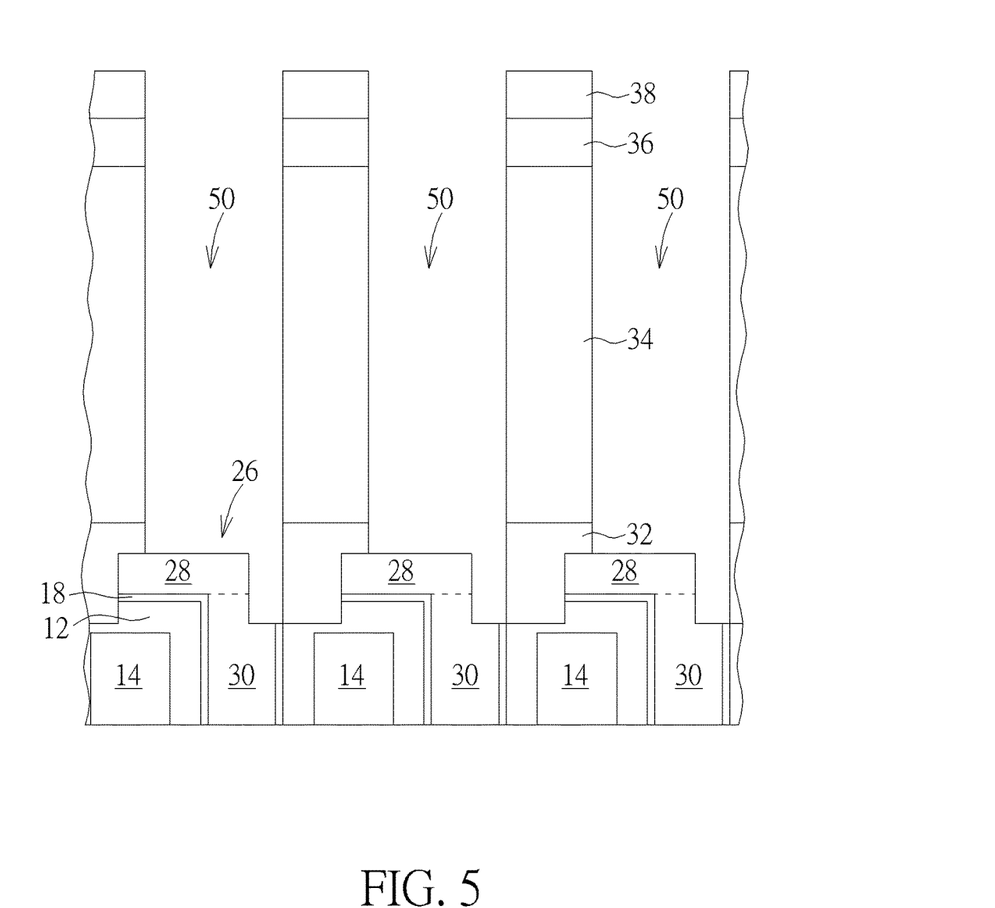

Next, as shown in FIG. 5, an etching process is conducted by using the remaining patterned mask layer 38 as mask to remove part of the silicon nitride layer 36, part of the silicon oxide layer 34, and part of the silicon nitride layer 32 to expose the top portion 28 and bottom portion 30 of the contact structures 26 for forming openings 50. Similar to the approach for forming the contact structures 26 as shown in FIG. 2, the etching process conducted to form the openings at this stage could include multiple stages to sequentially remove part of the silicon nitride layer 36, part of the silicon oxide layer 34, and part of the silicon nitride layer 32, in which content of the gas could be adjusted depending on the material of each layer accordingly. For instance, the gas used to remove part of the silicon oxide layer 34 could be selected from the group consisting of $C_4F_6$ and $C_4F_8$, and the gas used to remove part of the silicon nitride layers 32, 36 could be selected from the group consisting of $CHF_3$, $CH_2F_2$, and $C_4F_8$.

Figure 6:
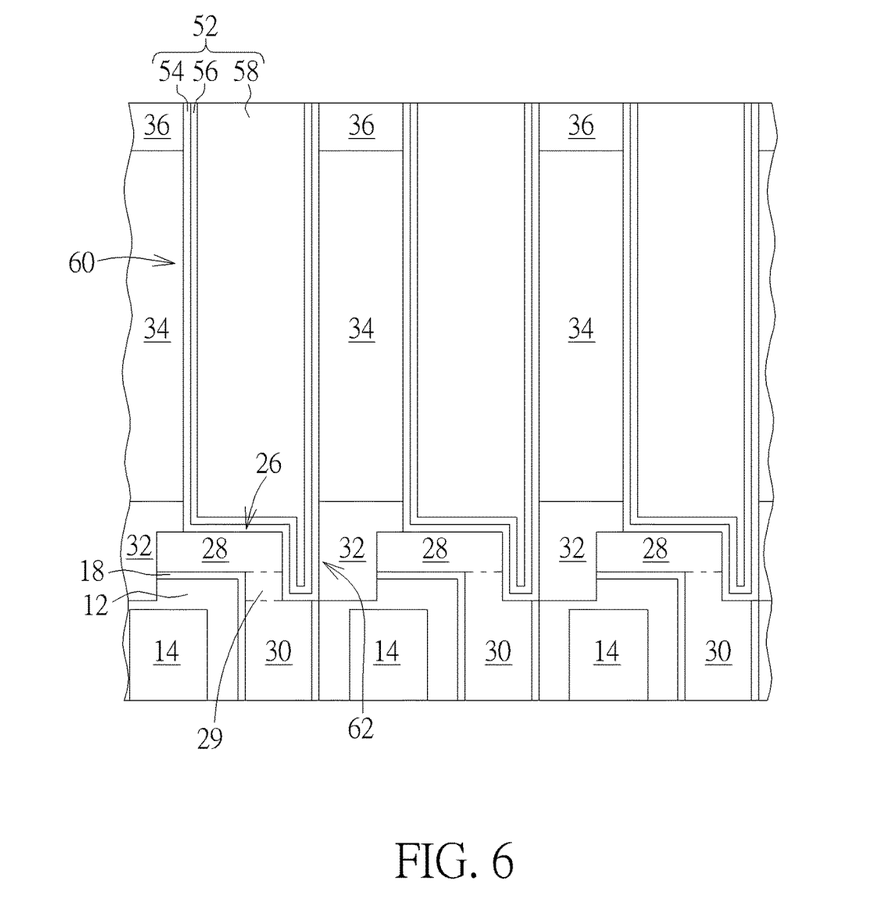

Next, as shown in FIG. 6, after removing the remaining mask layer 38, a capacitor 52 is formed in each of the openings 50 to contact the contact structures 26 directly. Specifically, the formation of the capacitors 52 could be accomplished by sequentially depositing a conductive layer, a dielectric layer, and another conductive layer in the openings 50, and a planarizing process such as chemical mechanical polishing (CMP) process is conducted to remove part of the conductive layer, part of the dielectric layer, and part of the conductive layer and even part of the silicon nitride layer 36 so that the top surface of the remaining conductive layer, dielectric layer, and conductive layer is even with the top surface of the silicon nitride layer 36. This forms a bottom electrode 54, capacitor dielectric layer 56, and top electrode 58 for each of the capacitors 52. This completes the fabrication of a semiconductor device according to an embodiment of the present invention. In this embodiment, the top electrode 58 and bottom electrode 54 could be made of same material or different material while both electrodes 54 and 58 could be selected from the group consisting of W, Ti, TiN, Ta, TaN, and Al and each of the electrodes 54 and 58 could also be a single layered structure or multi-layered structure. The capacitor dielectric layer 56 could be made of low leakage dielectric material including but not limited to for example oxide-nitride-oxide (ONO), silicon nitride, silicon oxide, silicon oxynitride, or combination thereof.

According to an embodiment of the present invention, the capacitor dielectric layer 56 could also include a high-k dielectric layer preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Referring again to FIG. 6, FIG. 6 illustrates a structural view of a semiconductor device according to an embodiment of the present invention. As shown in FIG. 6, the semiconductor device includes at least a contact structures 26 disposed in the insulating layer 12 and a capacitor 52 on the contact structure 26. Each of the contact structures 26 includes a bottom portion 30 disposed in the insulating layer 12, a middle portion 29 on the bottom portion 30, and a top portion 28 disposed on the middle portion 29 and extending to cover part of the insulating layer 12. The capacitor 52 is disposed on the contact structure 26 and contacting the top portion 28 and bottom portion 30 directly.

In this embodiment, the contact structure 26 is preferably divided into two portions by the dotted lines shown in the figure, in which the top portion 28 includes an I-shape while the bottom portion 30 includes a L-shape.

The capacitor 52 includes a main portion 60 disposed on the top portion 28 and an extension portion 62 protruding from the bottom of the main portion 60, in which the bottom portion of the main portion 60 is even with a top surface of the top portion 28 within the silicon nitride layer 32. The extension portion 62 on the other hand is inserted into the space between the top portion 28 and the silicon nitride layer 32 while contacting both the top portion 28 and bottom portion 30 of the contact structure 26.

The semiconductor device also includes a barrier layer 18 disposed between the bottom portion 30 and the insulating layer 12, in which the barrier layer 18 preferably includes TiN. Viewing from a more detailed perspective, the barrier layer 18 on one side of the bottom portion 30 and the barrier 18 on another side of the bottom portion 30 are asymmetrical. For instance, the barrier layer 18 on one side (such as the one on the right side in the figure) of the bottom portion 30 includes an I-shape and the barrier layer 18 one another side (such as the left side) of the bottom portion 30 includes a L-shape.

Figure 7:
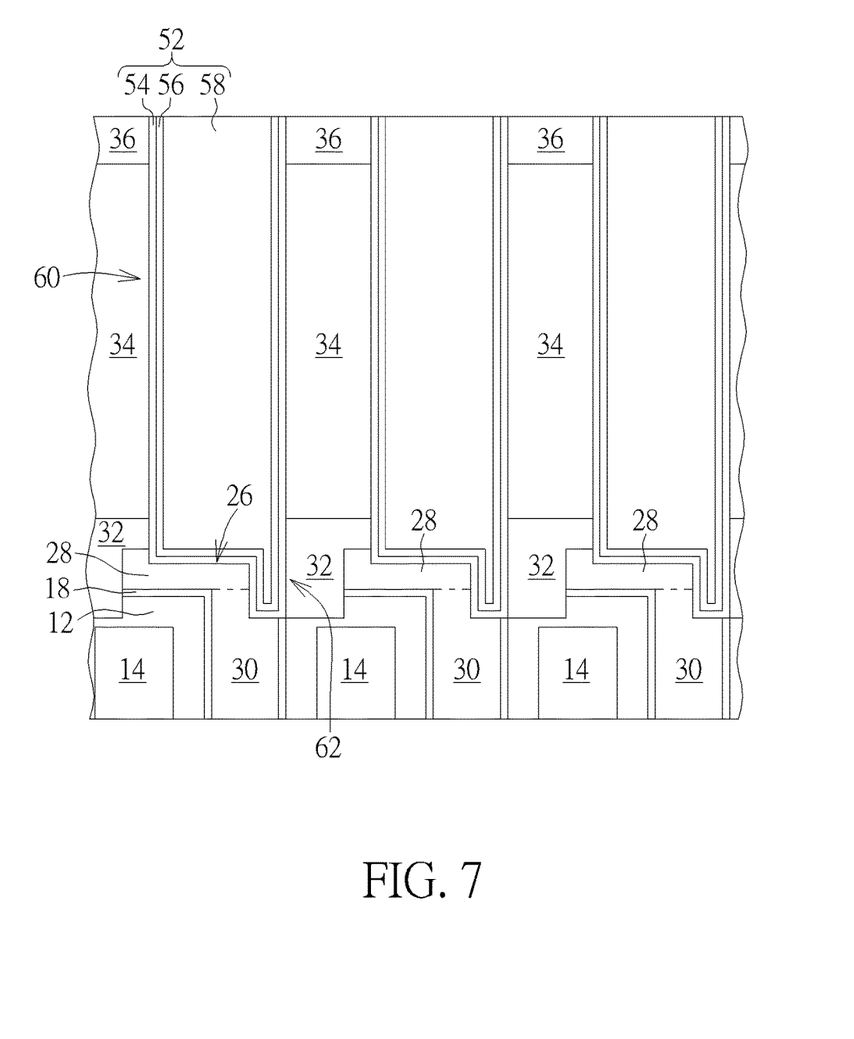
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to not removing any of the conductive layer 20 of the contact structures 26 as shown in FIG. 5, it would be desirable to first follow the process of FIG. 5 by using the patterned mask layer 38 as mask to remove part of the silicon nitride layer 36, part of the silicon oxide layer 34, and part of the silicon nitride layer 32 while removing part of the conductive layer 20 of the contact structures 26 at the same time, so that the openings 50 would be extended into part of the conductive layer 20 or the top portion 28. By doing so, after depositing the conductive layer and insulating layer to form the capacitor 52 the main portion 60 of the capacitor 52 would be inserted or extended into the top portion 28 of the contact structures 26 and viewing from another perspective, each of the top portion 28 and the bottom portion 30 would include a L-shape.

Figure 8:
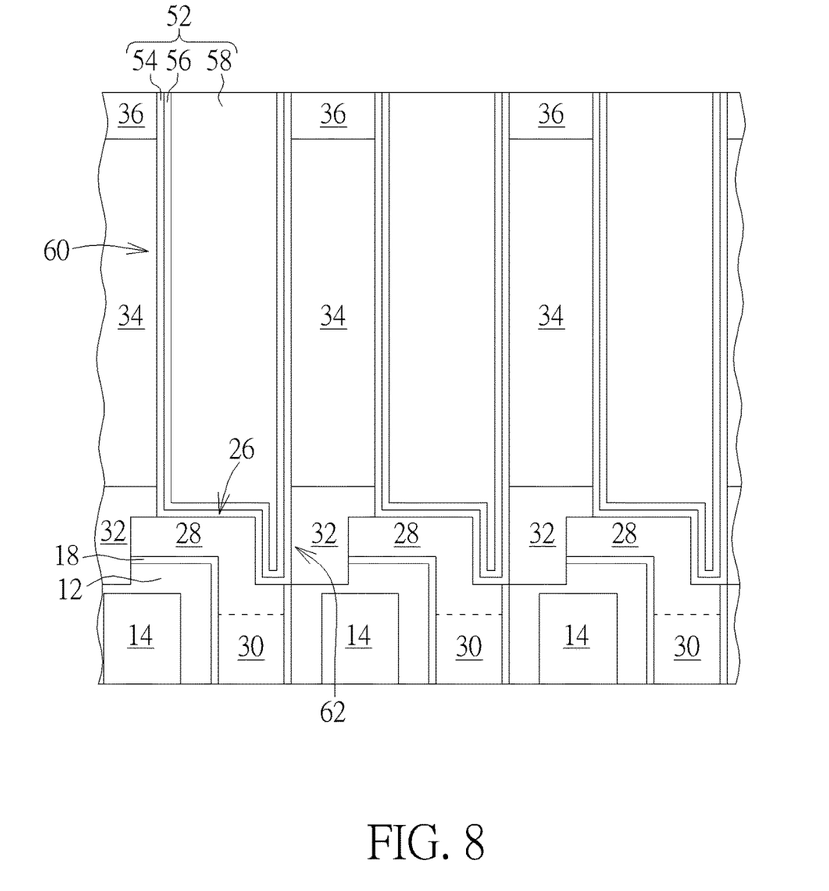
FIG. 8 illustrates a structural view of a semiconductor device according to an embodiment of the present invention.

Referring to FIG. 8, FIG. 8 illustrates a structural view of a semiconductor device according to an embodiment of the present invention. As shown in FIG. 8, the semiconductor device includes at least a contact structures 26 disposed in the insulating layer 12 and a capacitor 52 disposed on the contact structure 26, in which the contact structure 26 further includes a bottom portion 30 disposed in the insulating layer 12 and a top portion 28 disposed on the bottom portion 30 and extending to cover part of the insulating layer 12.

In contrast to the aforementioned embodiment of dividing the top portion 28 and the bottom portion 30 into I-shape and L-shape, the top and bottom portions of the contact structure 26 is divided according to the dotted lines illustrated in FIG. 8, in which the top portion 28 of the contact structure 26 includes two L-shapes while the bottom portion 30 includes an I-shape.

The capacitor 52 of this embodiment includes a main portion 60 disposed on the top portion 28 and an extension portion 62 protruding under the bottom of the main portion 60. Since the top portion 28 of the contact structure 26 overlaps the bottom portion 30 entirely so that the extension portion 62 of the capacitor 52 not contacting the bottom portion 30 directly, the extension portion 62 is preferably inserted or extended into part of the top portion 28 while the bottom surface of the extension portion 62 contacts the top portion 28 directly. Viewing from another perspective, the extension portion 62 preferably contacts two sidewalls of the top portion 30 while the extension portion 62 not overlapping the bit line structure 14 disposed in the insulating layer 12.

Figure 9:
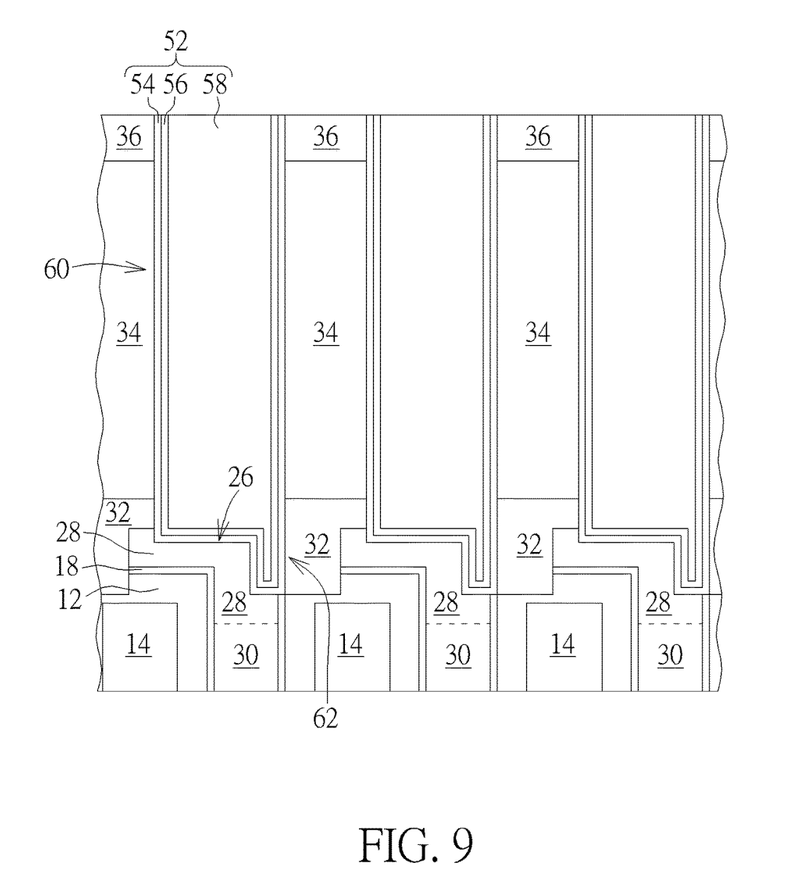
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, it would be desirable to combine the embodiments from FIGS. 7-8 by taking the feature of having the main portion 60 of the capacitor 52 to be extended into the top portion 28 of the contact structure 26 with the feature of having the extension portion 62 of capacitor 52 to be extended into part of the top portion 28 while the bottom surface of the extension portion 62 contacts the top portion 28 directly.

Figure 10:
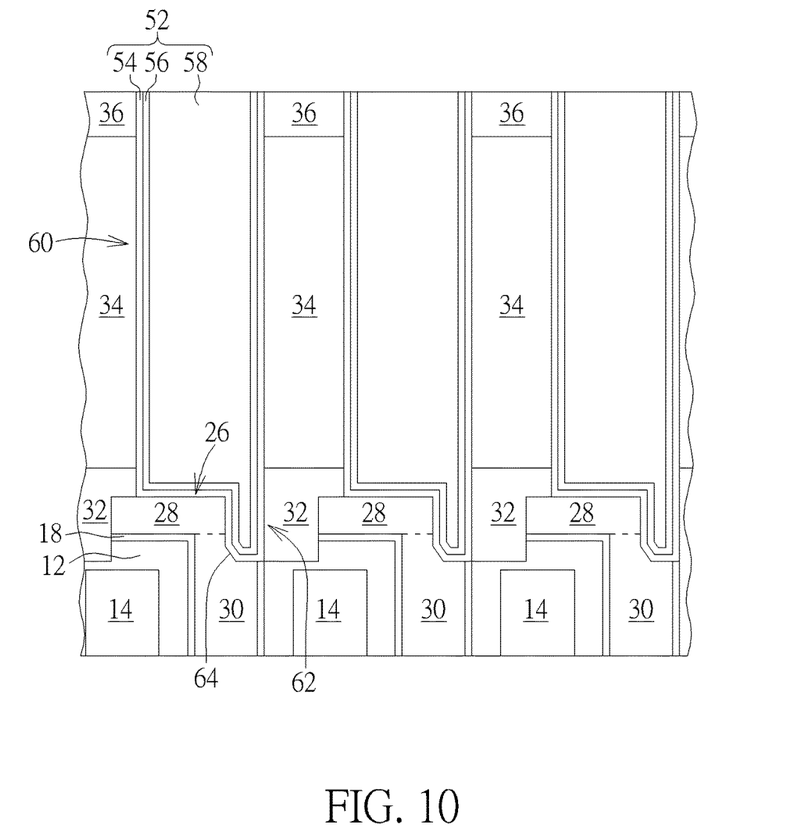
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, in contrast to the sidewalls and bottom surface of the extension portion 62 of the capacitor 52 to be planar surfaces as disclosed in the aforementioned embodiments, the sidewalls of the extension portion 62 of the capacitor 52 could include at least an inclined surface 64 while connecting the vertical sidewall and the planar surface.

Figure 11:
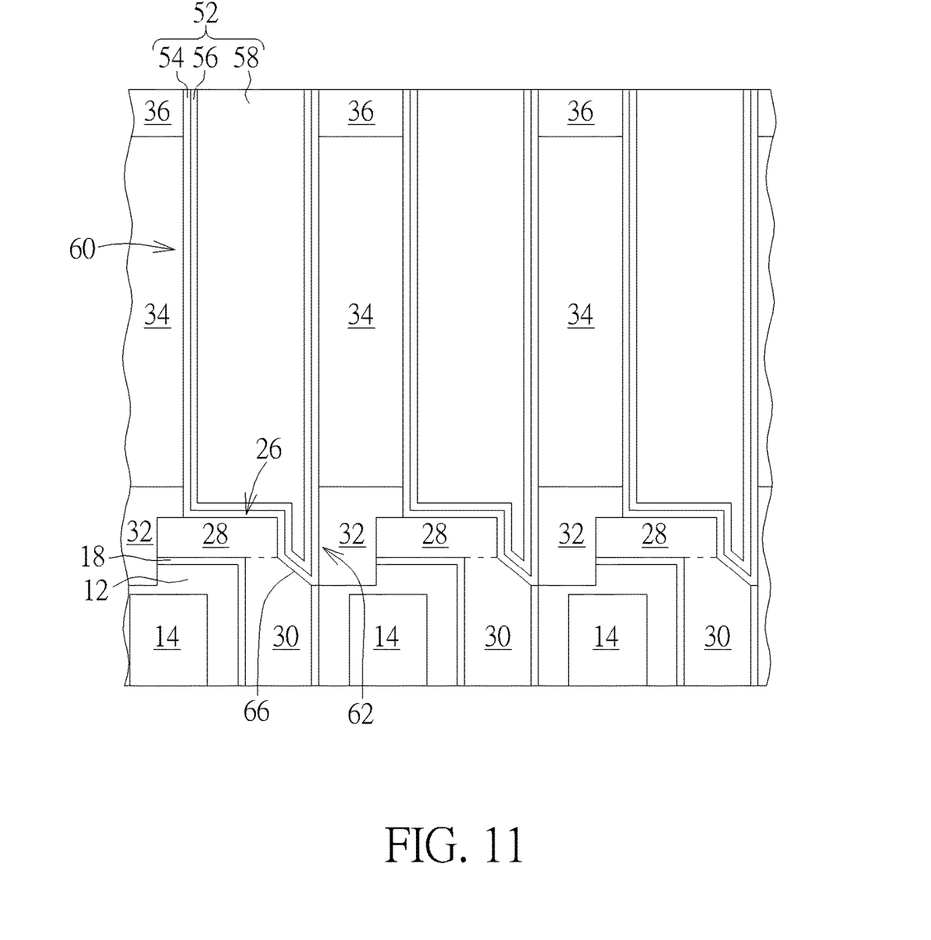
FIG. 11 illustrates a structural view of a semiconductor device according to an embodiment of the present invention.

Referring to FIG. 11, FIG. 11 illustrates a structural view of a semiconductor device according to an embodiment of the present invention. As shown in FIG. 11, in contrast to the sidewalls and bottom surface of the extension portion 62 of the capacitor 52 to be planar surfaces as disclosed in the aforementioned embodiments, the bottom of the extension portion 62 of the capacitor 52 in this embodiment preferably includes no planar surface whatsoever. Instead, the bottom of the extension portion 62 is formed by gradually shrinking the two vertical sidewalls downward and inward to form an inclined surface 66.

Figure 12:
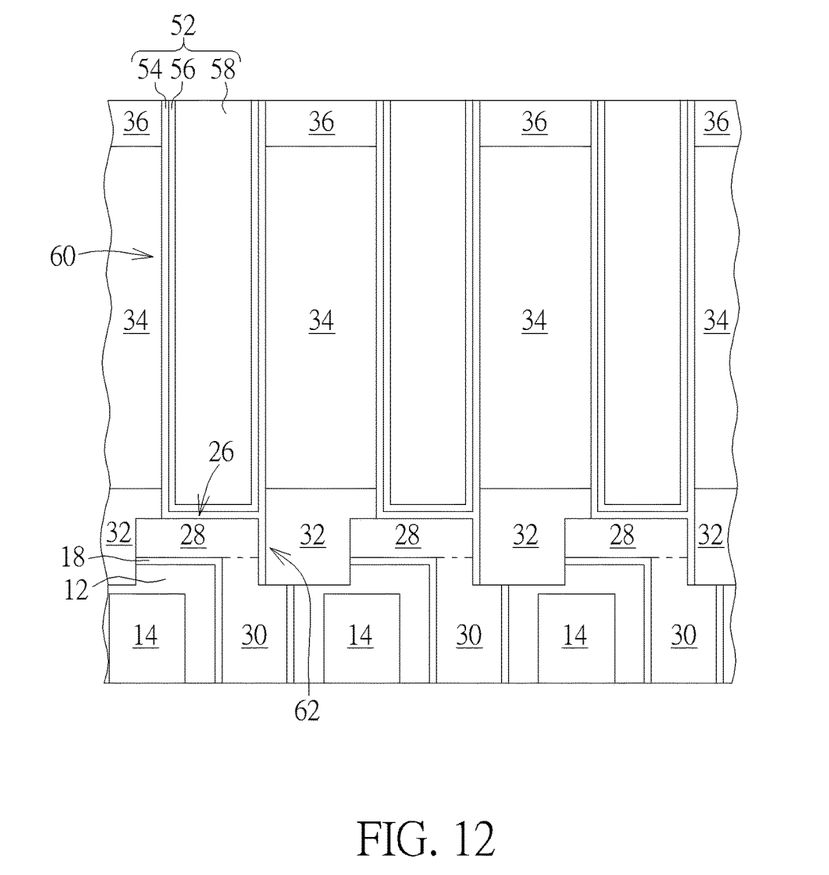
FIG. 12 illustrates a structural view of a semiconductor device according to an embodiment of the present invention.

Referring to FIG. 12, FIG. 12 illustrates a structural view of a semiconductor device according to an embodiment of the present invention. As shown in FIG. 12, it would be desirable to adjust the width of the opening 50 during the formation of the openings 50 in FIG. 5 by moving the right edge or sidewall of the openings 50 inward. By doing so, the bottom electrode 54 alone would fill the opening 50 between the top portion 28 and the silicon nitride layer 32 completely during the formation of the capacitor 52, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a contact structure, comprising:
      a bottom portion in an insulating layer;
      a middle portion on the bottom portion; and
      a top portion on the middle portion and extending to cover part of the insulating layer; and
   a capacitor on the contact structure,
   wherein the capacitor has a straight vertical structure, the top portion, the middle portion, and the bottom portion of the contact structure are integrally connected, and are rectangular in shape, respectively, wherein a width of the bottom portion is wider than a width of the middle portion; and the capacitor is directly contacting the top portion, the middle portion, and the bottom portion of the contact structure, respectively.

2. The semiconductor device of claim 1, further comprising a barrier layer between the bottom portion and the insulating layer.

3. The semiconductor device of claim 2, wherein the barrier layer comprises TiN.

4. The semiconductor device of claim 2, wherein the barrier layer on one side of the bottom portion and the barrier layer on another side of the bottom portion are asymmetrical.

5. The semiconductor device of claim 2, wherein the barrier layer on one side of the bottom portion comprises an I-shape and the barrier layer on another side of the bottom portion comprises a L-shape.

6. The semiconductor device of claim 1, wherein the top portion comprises an I-shape and the bottom portion comprises a L-shape.

7. The semiconductor device of claim 1, wherein the top portion comprises a L-shape and the bottom portion comprises another L-shape.

8. A semiconductor device, comprising:
   a contact structure, comprising:
      a bottom portion in an insulating layer;
      a middle portion on the bottom portion; and
      a top portion on the middle portion and extending to cover part of the insulating layer; and
   a capacitor on the contact structure, wherein the capacitor comprises:

a main portion on the top portion; and an extension portion protruding from a bottom of the main portion, wherein the extension portion is inserted into part of the top portion and a bottom surface of the extension portion contacting the top portion directly, wherein the capacitor has a straight vertical structure, the extension portion of the capacitor includes a bottom electrode, a capacitor dielectric layer, and a top electrode; the top portion, the middle portion, and the bottom portion of the contact structure are integrally connected, and are rectangular in shape, respectively, wherein a width of the bottom portion is wider than a width of the middle portion; and the capacitor is directly contacting the top portion, the middle portion, and the bottom portion of the contact structure, respectively.

9. The semiconductor device of claim 8, further comprising a barrier layer between the bottom portion and the insulating layer.

10. The semiconductor device of claim 8, wherein the extension portion contacts two sidewalls of the top portion directly.

11. The semiconductor device of claim 8, wherein the insulating layer comprises a bit line structure and the extension portion not overlapping the bit line structure.

12. The semiconductor device of claim 8, wherein the main portion and the extension portion are inserted into the top portion.

13. The semiconductor device of claim 2, wherein a sidewall of the capacitor is aligned with a sidewall of the barrier layer.

* * * * *